(12) United States Patent
Gorin

(10) Patent No.: US 8,852,522 B1
(45) Date of Patent: Oct. 7, 2014

(54) PLASMA DE-ACTIVATION APPARATUS AND METHOD

(71) Applicant: Georges J. Gorin, San Rafael, CA (US)

(72) Inventor: Georges J. Gorin, San Rafael, CA (US)

(*) Notice: Subject to any disclaimer, the term of this patent is extended or adjusted under 35 U.S.C. 154(b) by 187 days.

(21) Appl. No.: 13/684,726

(22) Filed: Nov. 26, 2012

(51) Int. Cl.
*B01J 19/08* (2006.01)

(52) U.S. Cl.
USPC ............................ 422/186.29; 204/164

(58) Field of Classification Search
USPC .............................. 422/186.29, 164
See application file for complete search history.

(56) References Cited

U.S. PATENT DOCUMENTS

2005/0178746 A1* 8/2005 Gorin .................... 219/121.43

* cited by examiner

*Primary Examiner* — Kishor Mayekar
(74) *Attorney, Agent, or Firm* — Kevin Roe

(57) ABSTRACT

An apparatus and method to de-activate a plasma from one or more plasma sources in at least one passageway having a tuned LC circuit. A first embodiment of the invention involves a method to de-activate a plasma. A second embodiment of the invention involves an apparatus to de-activate a plasma. Certain embodiments of the invention can also be used to maximize the production of activated neutral atoms and molecules from the de-activation apparatus.

21 Claims, 14 Drawing Sheets

PLASMA DE-ACTIVATION APPARATUS AND METHOD

BACKGROUND OF THE INVENTION

1. Field of the Invention

This invention relates to the use of a plasma or a glow discharge for dissociating one or more gases into reactive and non-reactive ionic and reactive and non-reactive neutral species, and in particular, to de-activating such a plasma.

2. Description of the Prior Art

Plasma apparatus can be divided into two broad categories, downstream or remote plasma and direct plasma. In downstream plasma, the article(s) are not immersed in the glow discharge, as it is in direct plasma. The result is a purely chemical and multi-directional process resulting in a somewhat more gentle treatment of the article(s) because high power electromagnetic waves at high frequency are not coupled through the article(s) and there is no heating from direct ion bombardment. In either type of apparatus, it is known in the art to employ some type of plasma for processing one or more article(s).

Typically, one or more reactive gases (such as, oxygen-based gases, or halogen-based gases, including fluorine, chlorine, bromine, or other equivalent gases, as well as gas molecular compounds having one or more oxygen or halogen atoms), are used in combination with other gases due to the highly reactive nature of the reactive gas(es), in a plasma chamber.

In the prior art, a major problem to solve in order to obtain an electrically charge free process is the need for de-activation of a plasma, such as the need for recombination of the charged particles to form neutral particles. De-activation of the plasma means the removal of all electrically charged reactive and un-reactive species from the plasma. In the prior art, the de-activation of a plasma is achieved by using a long path (up to one meter in length) from the plasma chamber to a sample chamber, or the use of baffles to essentially increase the path length by convolutions so that a plasma is de-activated before it reaches the sample chamber. Another option is to use a wire mesh screen between the plasma generation chamber and the sample chamber to form a Faraday shield.

Another problem in the prior art is that the means used to eliminate the electrical charges also results in a loss of the desired reactive neutrals.

In view of the foregoing, what is needed is an improved method and apparatus for efficiently and selectively de-activating a plasma to eliminate the reactive and non-reactive electrically charged species.

SUMMARY OF THE INVENTION

The present invention includes a passageway in the exhaust side of the discharge chamber or plasma chamber containing one or more gases, where a de-activation of the plasma can be achieved before the plasma travels further towards a sample. In one embodiment of the invention, one or more gases are dissociated, which could include one or more inert gases and one or more reactive gases (e.g., a oxygen-based or halogen-based gas) with or without other gases. The invention can be implemented in numerous ways, such as by a method, an apparatus, or a plasma system. Four aspects of the invention are described below.

A first aspect of the invention is directed to a method for treating one or more articles with a selectively de-activated plasma generated from dissociating one or more gases. The method includes supplying one or more gases from a source to a first chamber; applying RF power to dissociate said one or more gases and create a plasma; withdrawing the dissociated one or more gases from the first chamber through a passageway, wherein the passageway has a tuned LC circuit with a tuned frequency to selectively de-activate plasma in the passageway; and supplying the dissociated one or more gases to a second chamber containing one or more articles.

A second aspect of the invention is directed to a method for treating one or more articles with a selectively de-activated plasma generated by dissociating one or more gases. The method includes supplying one or more gases from a first source to a first chamber, applying RF power to dissociate one or more gases in the first source and create a first plasma, withdrawing the first plasma from said first chamber through a first passageway and selectively de-activating the first plasma with a first passageway having a first tuned LC circuit having a first tuned frequency to selectively de-activate the first plasma; supplying one or more gases from a second source to a second chamber for RF power to dissociate said one or more gases from the second source to create a second plasma; using a second passageway to withdraw the second plasma from the second chamber and selectively de-activating the second plasma in said second passageway having a second tuned LC circuit having a second tuned frequency to selectively de-activate the second plasma; and supplying de-activated first plasma from the first chamber and de-activated second plasma from the second chamber to a third chamber containing one or more articles.

A third aspect of the invention is directed to an apparatus to dissociate one or more gases to produce a plasma. The apparatus includes a first chamber with a first passageway, coupled to a first source of one or more gases; one or more RF energy sources coupled to the first chamber; means for disassociating the one or more gases in the first chamber into a plasma; a second passageway having a tuned LC circuit to selectively de-activate the plasma into a de-activated plasma, and a second chamber coupled to the first chamber through the second passageway to receive the de-activated plasma, wherein the second chamber contains one or more articles.

A fourth aspect of the invention is directed to an apparatus to dissociate one or more gases to produce a plasma. The apparatus includes a first chamber with a first passageway, coupled to a first source of one or more gases; a second chamber with a second passageway, coupled to a second source of one or more gases; one or more RF energy sources coupled to the first chamber and the second chamber; means for dissociating the one or more gases from the first port into a first plasma in the first chamber and for dissociating one or more gases from the second port into a second plasma in the second chamber; at least one passageway having an externally modifiable tuned LC circuit to selectively de-activate at least one plasma from either the first chamber or from the second chamber; and a third chamber coupled to the first chamber and the second chamber, wherein the third chamber contains one or more articles.

These and other objects and advantages of the invention will become apparent to those skilled in the art from the following detailed description of the invention and the accompanying drawings.

DETAILED DESCRIPTION OF THE PREFERRED EMBODIMENT

The invention provides a method, an apparatus, and a system to de-activate a plasma. Various embodiments of the invention can be applied to biological applications, medical applications, chemical applications, electronic applications, and any other applications where plasma can be beneficially used. Inductive coupling or capacitive coupling can be used to couple radio-frequency (RF) electromagnetic energy to one or more gases for dissociation and creation of plasma. In this specification, drawings, and claims, radio-frequency (RF) is defined as any frequency of electromagnetic energy where inductive coupling to a plasma and a tuned LC circuit can be implemented.

In one embodiment of the invention, a selectively tuned LC circuit can be tuned to the same frequency (and/or a harmonic of the same frequency) that was used to generate a plasma, so that the selectively tuned LC circuit can de-activate and remove energy from a plasma. Certain embodiments of the invention can de-activate plasma and also at the same time be used to maximize the production of activated neutral atoms and molecules from a plasma source.

Figure 1:
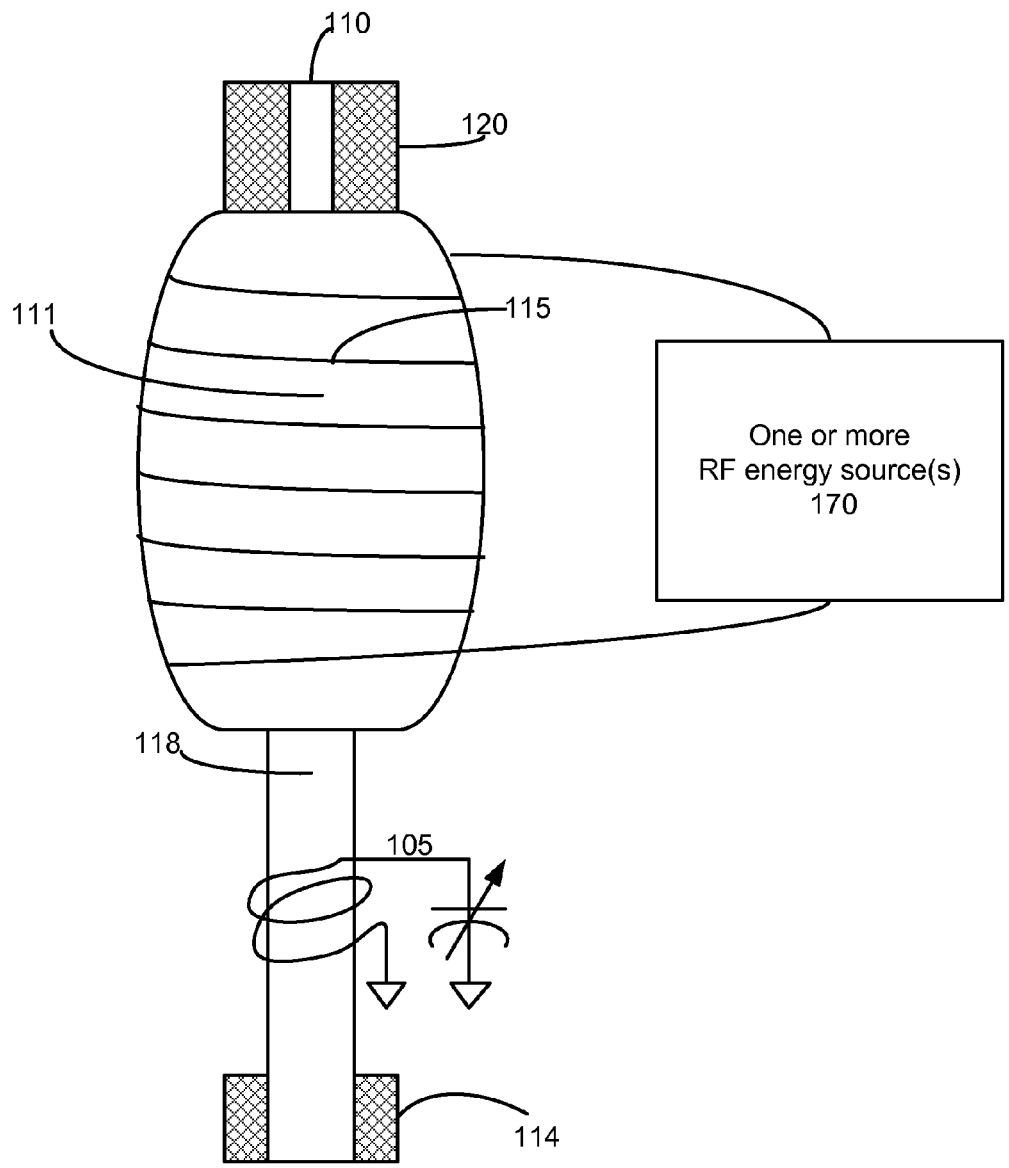
FIG. 1 illustrates a plasma generating and de-activation apparatus constructed in accordance with one embodiment of the invention.

In FIG. 1, a plasma generating discharge chamber includes a gas inlet 120 which supplies one or more gases to discharge chamber 111. Discharge chamber 111 also has a capillary tube 110 to prevent plasma expansion into gas inlet 120. One or more radio-frequency (RF) energy sources 170 are coupled to inductor 115, which surrounds discharge chamber 111 and dissociates one or more gases passing through discharge chamber 111, which may be made of various materials (e.g., a dielectric material or an equivalent). Discharge chamber 111 is coupled to a sample chamber (not shown) by a passageway 118 and an output port 114. Passageway 118 has a tuned LC circuit 105 that is grounded on the exhaust side of the passageway 118 to prevent unwanted capacitive coupling if a Faraday shield is not used, and that can be selectively tuned by a user (e.g., by adjusting an external variable capacitor and/or inductor) to match the same radio frequency used to generate the plasma in the discharge chamber 111, and thereby de-activate and remove energy and charged particles from the plasma.

In various embodiments, the passageway 118 can be fabricated from quartz or ceramic tubes, or tubes of equivalent materials. In one embodiment, the tuned LC circuit 105 includes electrically conductive metal (e.g., copper, silver, aluminum, gold, or various metal alloys or electrically conductive coatings, or equivalents), such as wires with a gauge of 12 to 18, or coils including electrically conductive metal with a diameter ranging from one eighth of an inch (~0.3 centimeters) to one quarter of an inch (~0.6 centimeters). In another embodiment, the tuned LC circuit 105 is wound around a Faraday shield (not shown) to prevent undesirable capacitive coupling and increase the inductive coupling between the plasma and the tuned LC circuit. In one embodiment, 12 to 18 gauge conductive metal wire is wound around a magnetic core as shown on FIG. 6A when RF power levels are low (for example, less than 500 watts). In one embodiment, the conductive metal wire is wound around the passageway 118 and cooled by forced air.

The choice of cooling for the coil and the type of capacitor used in the tuned LC circuit are a function of the RF electrical current to be handled by the tuned LC circuit. In one embodiment, a variable air capacitor is used when the current flow in the tuned LC circuit is low. In one embodiment of the invention, the RF tuning requirement should satisfy the following equation, where L is the total inductance, C is the total capacitance, and F is the resonant frequency (which should match the frequency of the plasma generator):

$$L*C*(2*3.1416*F)\exp2=1 \tag{1}$$

The preferred range of values for C are 50 pF (picoFarads) to 25 pF (picoFarads) and the corresponding values for total inductance (L of the coil+L1 of an external inductor) will be 2.7 uH (microHenrys) to 5.5 uH (microHenrys).

Figure 2:
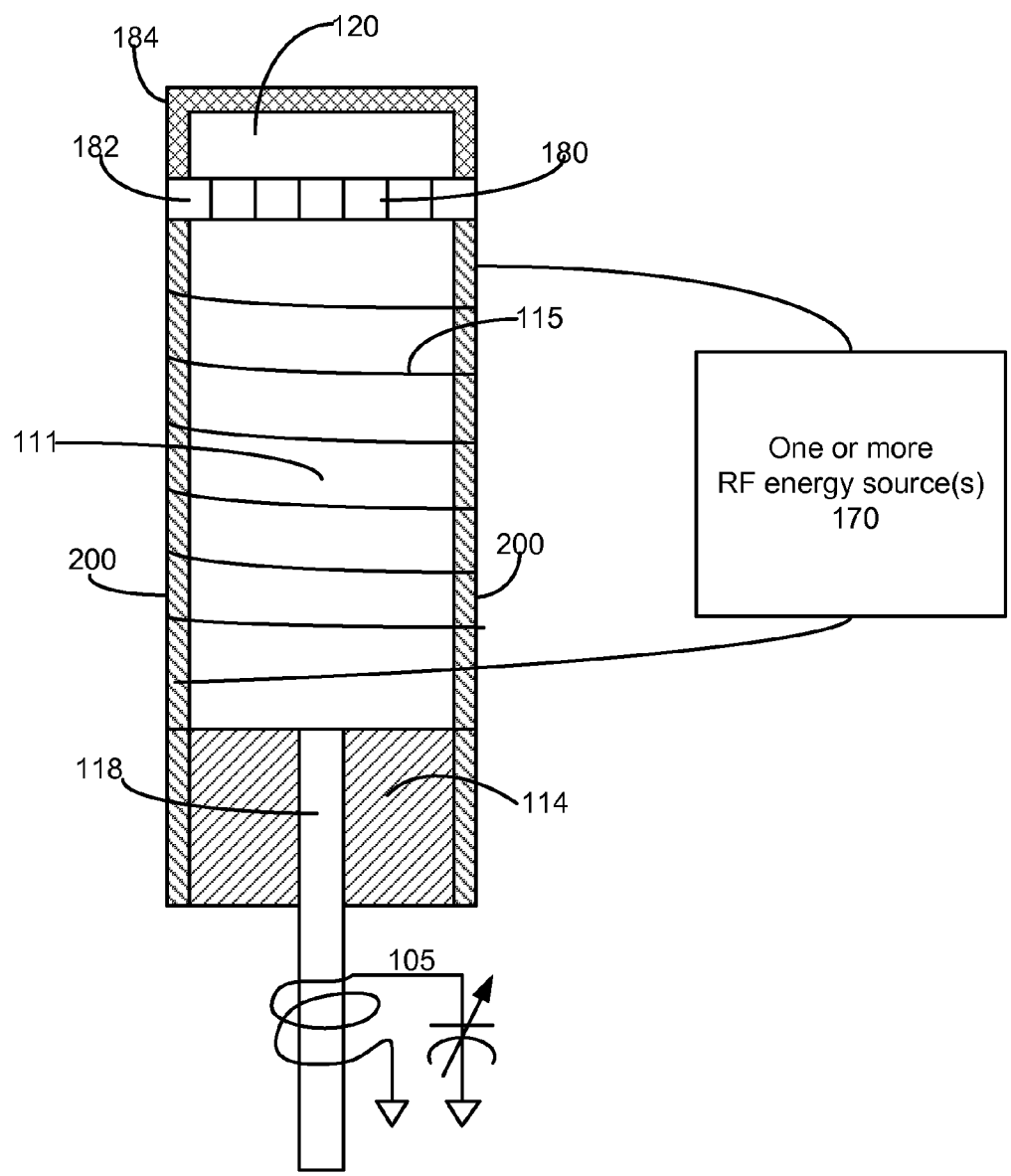
FIG. 2 illustrates a plasma generating and de-activation apparatus constructed in accordance with an alternative embodiment the invention.

In FIG. 2, a plasma generating chamber has a gas inlet 120 which supplies one or more gases to discharge chamber 111. A metal or dielectric material 184 encloses gas inlet 120 and a dielectric layer 182 has small openings (e.g., holes, slots, or equivalent perforations) 180 to prevent plasma expansion upstream from discharge chamber 111 through gas inlet 120. One or more RF energy sources 170 are coupled to inductor 115, which surrounds discharge chamber 111 and dissociates one or more gases passing through discharge chamber 111. The discharge chamber walls 200 may be made of various materials (e.g., a dielectric material such as, ceramic, glass, or an equivalent). Discharge chamber 111 is coupled to a sample chamber (not shown) by a passageway 118 and an output port 114. In various embodiments, the passageway 118 can be fabricated from quartz or ceramic tubes. Passageway 118 has a tuned LC circuit 105 that is grounded on the exhaust side of the passageway 118 to prevent unwanted capacitive coupling if a Faraday shield is not used, and that can be selectively tuned by a user (e.g., by adjusting an external variable capacitor and/or inductor) to match the same radio frequency used to generate the plasma in the discharge chamber 111, and thereby de-activate and remove energy and charged particles from the plasma. In one embodiment, the tuned LC circuit 105 includes electrically conductive metal (e.g., copper, silver, aluminum, gold, or various metal alloys or electrically conductive coatings, or equivalents), such as wires with a gauge of 12 to 18, or coils including electrically conductive metal with a diameter ranging from one eighth of an inch (~0.3 centimeters) to one quarter of an inch (~0.6 centimeters). In another embodiment, the tuned LC circuit 105 is wound around a Faraday shield (not shown) to increase the inductive coupling between the plasma and the tuned LC circuit. In one embodiment, 12 to 18 gauge conductive metal wire is wound around a magnetic core as shown on FIG. 6A when RF power levels are low (for example, less than 500 watts). In one embodiment, the conductive metal wire is wound around the passageway 118 and cooled by forced air.

Figure 3:
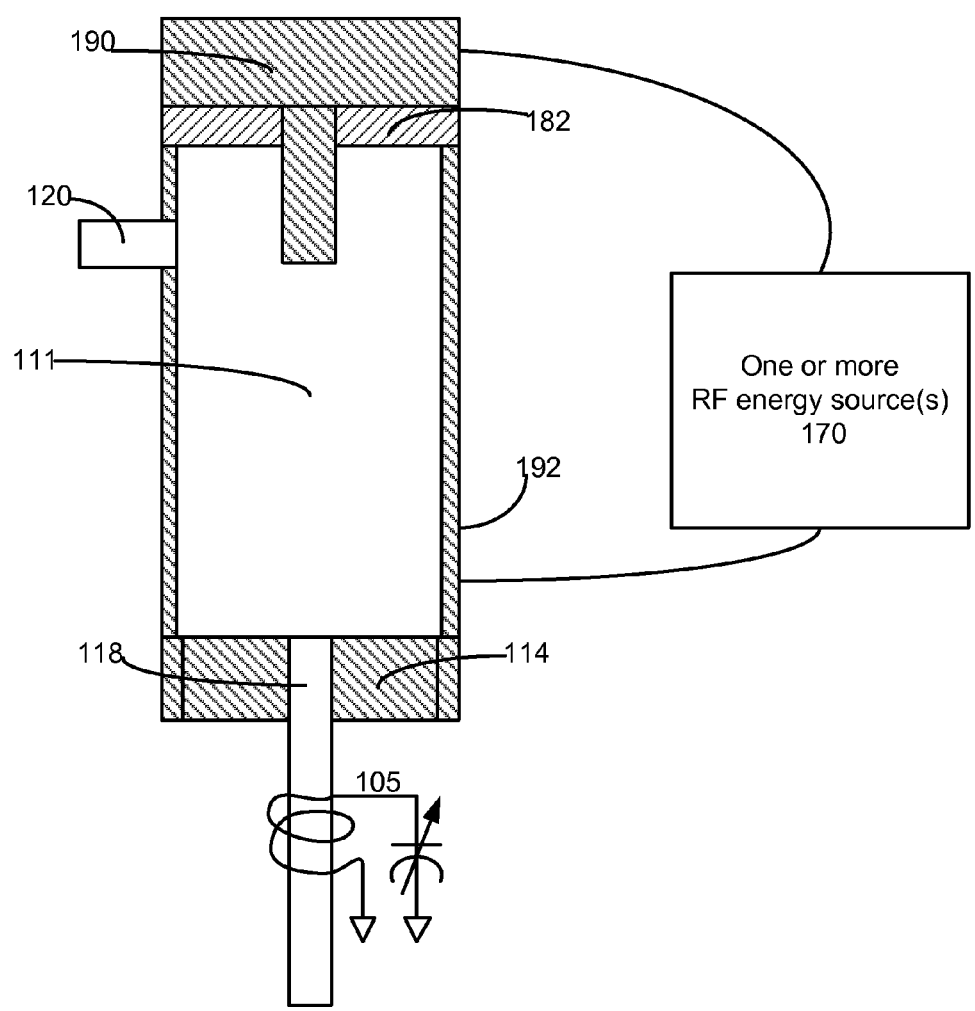
FIG. 3 illustrates a plasma generating and de-activation apparatus constructed in accordance with an alternative embodiment of the invention.

In FIG. 3, gas inlet 120 with a means to control backwards plasma expansion supplies one or more gases to discharge chamber 111. Discharge chamber 111 also has a dielectric layer 182 between the discharge chamber 111 and a protruding first electrode 190. Both the first electrode 190 and a second electrode 192 are connected to one or more RF energy sources 170. One or more RF energy sources 170 provide the power to dissociate one or more gases passing through discharge chamber 111. Discharge chamber 111 is coupled to a sample chamber (not shown) by a passageway 118 and an output port 114. In various embodiments, the passageway 118 can be fabricated from quartz or ceramic tubes. Passageway 118 has a tuned LC circuit 105 that is grounded on the exhaust side of the passageway 118 to prevent unwanted capacitive coupling if a Faraday shield is not used, and that can be selectively tuned by a user (e.g., by adjusting an external variable capacitor and/or inductor) to match the same radio frequency used to generate the plasma in the discharge chamber 111, and thereby de-activate and remove energy and charged particles from the plasma. In one embodiment, the tuned LC circuit 105 includes electrically conductive metal (e.g., copper, silver, aluminum, gold, or various metal alloys or electrically conductive coatings, or equivalents), such as wires with a gauge of 12 to 18, or coils including electrically conductive metal with a diameter ranging from one eighth of an inch (~0.3 centimeters) to one quarter of an inch (~0.6 centimeters). In another embodiment, the tuned LC circuit 105 is wound around a Faraday shield (not shown) to increase the inductive coupling between the plasma and the tuned LC circuit. In one embodiment, 12 to 18 gauge conductive metal wire is wound around a magnetic core as shown on FIG. 6A when RF power levels are low (for example, less than 500 watts). In one embodiment, the conductive metal wire is wound around the passageway 118 and cooled by forced air.

Figure 4:
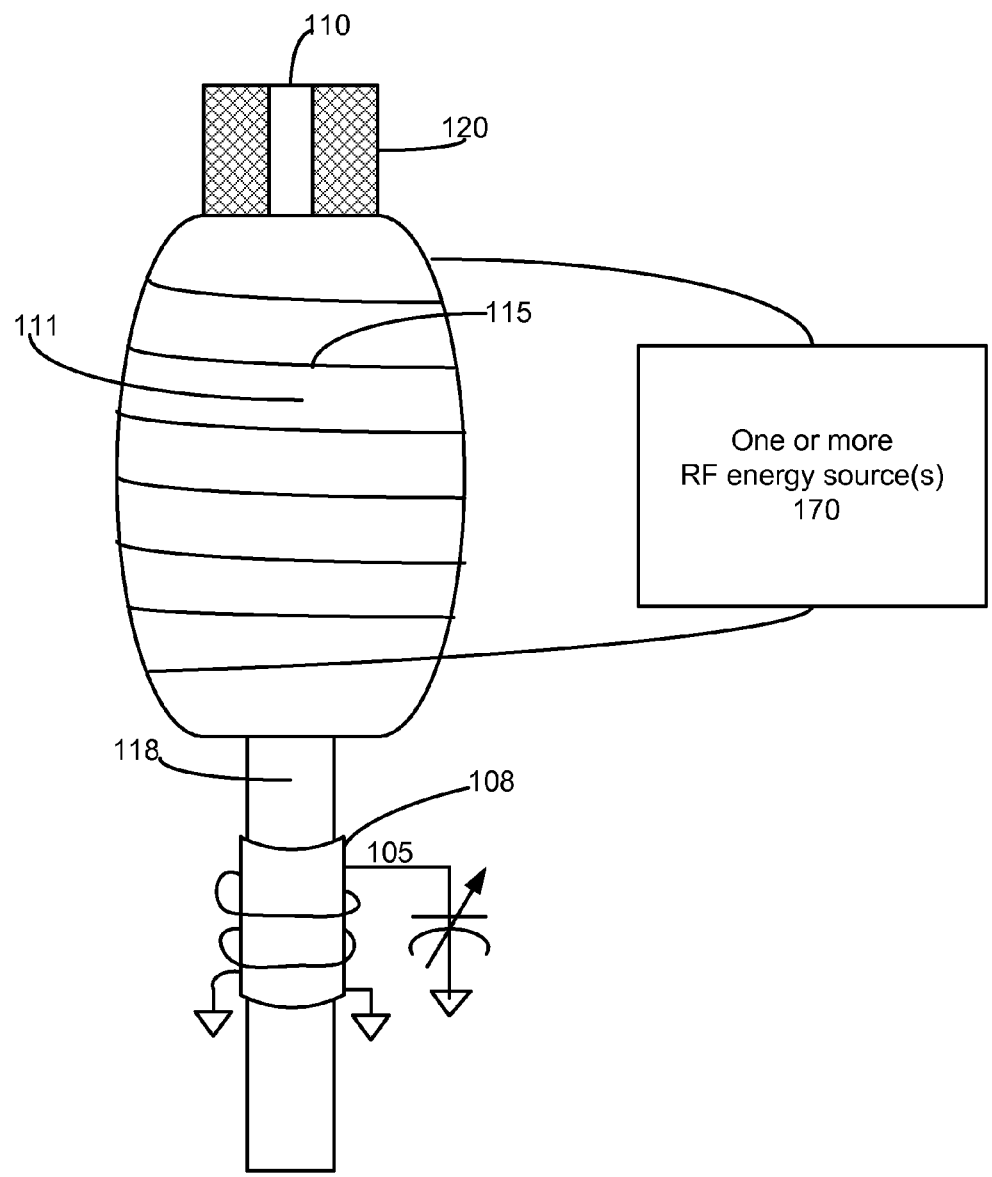
FIG. 4 illustrates a plasma generating and de-activation apparatus constructed in accordance with an alternative embodiment of the invention.

In FIG. 4, a plasma generating discharge chamber includes a gas inlet 120 which supplies one or more gases to discharge chamber 111. Discharge chamber 111 also has a capillary tube 110 to prevent plasma expansion into gas inlet 120. One or more radio-frequency (RF) energy sources 170 are coupled to inductor 115, which surrounds discharge chamber 111 and dissociates one or more gases passing through discharge chamber 111, which may be made of various materials (e.g., a dielectric material or an equivalent). Discharge chamber 111 is coupled to a sample chamber (not shown) by a passageway 118. In this embodiment, the tuned LC circuit 105 is wrapped around a Faraday shield 108 to increase the inductive coupling between the plasma and the tuned LC circuit 105. In various embodiments, the passageway 118 can be fabricated from quartz or ceramic tubes. The tuned LC circuit 105 is grounded and can be selectively tuned by a user (e.g., by adjusting an external variable capacitor and/or inductor) to match the same radio frequency used to generate the plasma in the discharge chamber 111, and thereby de-activate and remove energy and charged particles from the plasma. In one embodiment, the tuned LC circuit 105 includes electrically conductive metal (e.g., copper, silver, aluminum, gold, or various metal alloys or electrically conductive coatings, or equivalents), such as wires with a gauge of 12 to 18, or coils including electrically conductive metal with a diameter ranging from one eighth of an inch (~0.3 centimeters) to one quarter of an inch (~0.6 centimeters). In one embodiment, 12 to 18 gauge conductive metal wire is wound around a magnetic core as shown on FIG. 6A when RF power levels are low (for example, less than 500 watts). In one embodiment, the conductive metal wire is wound around the passageway 118 and cooled by forced air.

Figure 5:
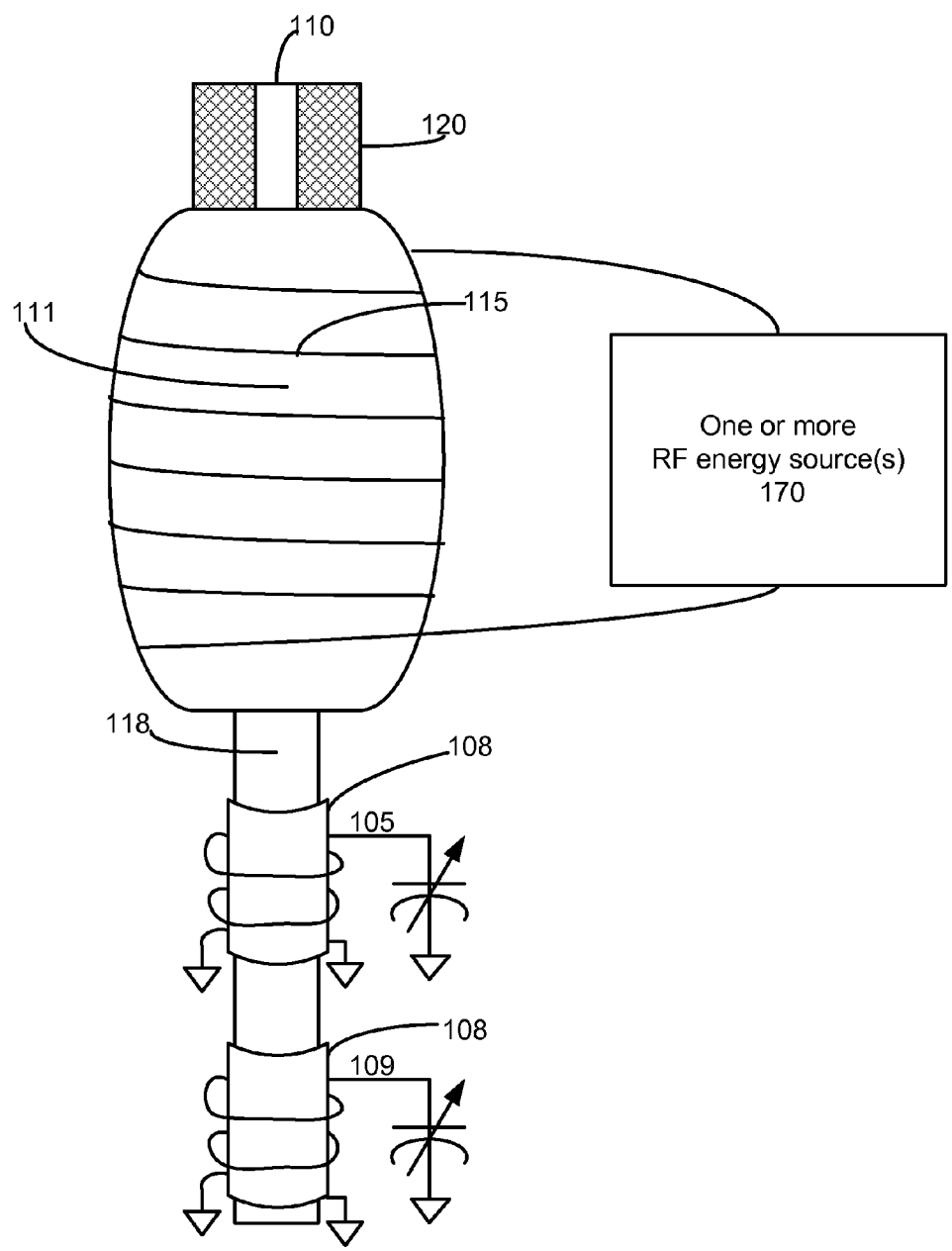
FIG. 5 illustrates a plasma generating and de-activation apparatus constructed in accordance with an alternative embodiment of the invention.

In FIG. 5, a plasma generating discharge chamber includes a gas inlet 120 which supplies one or more gases to discharge chamber 111. Discharge chamber 111 also has a capillary tube 110 to prevent plasma expansion into gas inlet 120. One or more radio-frequency (RF) energy sources 170 are coupled to inductor 115, which surrounds discharge chamber 111 and dissociates one or more gases passing through discharge chamber 111, which may be made of various materials (e.g., a dielectric material or an equivalent). Discharge chamber 111 is coupled to a sample chamber (not shown) by a passageway 118. In this embodiment, the tuned LC circuit 105 and tuned LC circuit 109 are wrapped around a Faraday shield 108 to increase the inductive coupling between the plasma and the tuned LC circuit 105. In various embodiments, the passageway 118 can be fabricated from quartz or ceramic tubes. The tuned LC circuit 105 is grounded and can be selectively tuned by a user (e.g., by adjusting an external variable capacitor and/or inductor) to match the same radio frequency used to generate the plasma in the discharge chamber 111, and thereby de-activate and remove energy and charged particles from the plasma. The tuned LC circuit 109 is grounded and can be selectively tuned by a user (e.g., by adjusting an external variable capacitor and/or inductor) to match a harmonic (e.g., a second harmonic, a third harmonic, a fourth harmonic, and so forth) of the radio frequency used to generate the plasma in the discharge chamber 111, and thereby de-activate and remove energy and charged particles from the plasma. In one embodiment, the tuned LC circuit 105 and tuned LC circuit 109 include electrically conductive metal (e.g., copper, silver, aluminum, gold, or various metal alloys or electrically conductive coatings, or equivalents), such as wires with a gauge of 12 to 18, or coils including electrically conductive metal with a diameter ranging from one eighth of an inch (~0.3 centimeters) to one quarter of an inch (~0.6 centimeters). In one embodiment, 12 to 18 gauge conductive metal wire is wound around a magnetic core as shown on FIG. 6A when RF power levels are low (for example, less than 500 watts). In one embodiment, the conductive metal wire is wound around the passageway 118 and cooled by forced air.

Figure 6A:
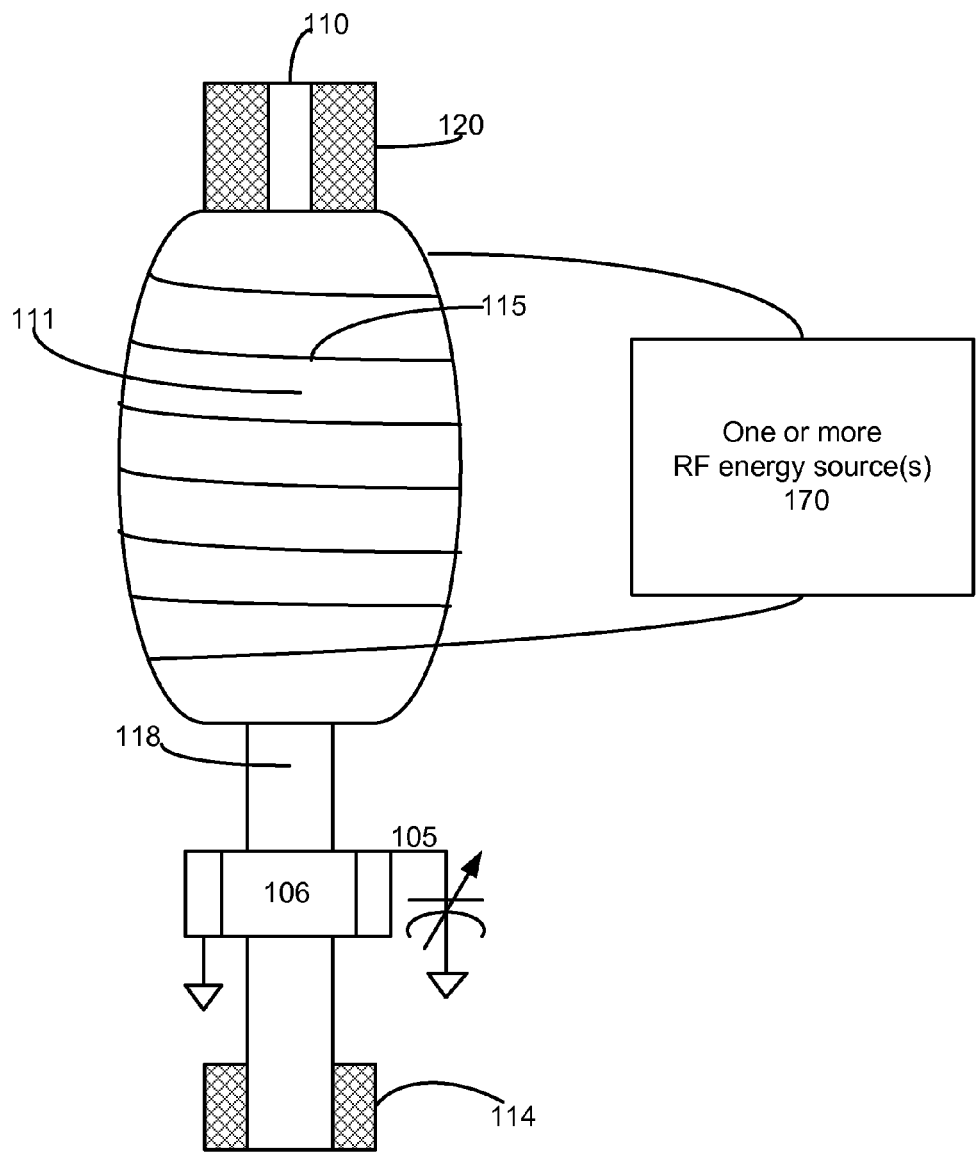
FIG. 6A illustrates a plasma generating and de-activation apparatus constructed in accordance with one embodiment of the invention.

In FIG. 6A, a plasma generating discharge chamber includes a gas inlet 120 which supplies one or more gases to discharge chamber 111. Discharge chamber 111 also has a capillary tube 110 to prevent plasma expansion into gas inlet 120. One or more radio-frequency (RF) energy sources 170 are coupled to inductor 115, which surrounds discharge chamber 111 and dissociates one or more gases passing through discharge chamber 111, which may be made of various materials (e.g., a dielectric material or an equivalent).

Discharge chamber 111 is coupled to a sample chamber (not shown) by a passageway 118 and an output port 114. In various embodiments, the passageway 118 can be fabricated from quartz or ceramic tubes. Passageway 118 has a tuned LC circuit 105 that is grounded on the exhaust side of the passageway 118 to prevent unwanted capacitive coupling if a Faraday shield is not used, and the tuned LC circuit 105 includes a toroidal coil 106 that is grounded, where the tuned LC circuit 105 can be selectively tuned by a user (e.g., by adjusting an external variable capacitor and/or inductor) to match the same radio frequency (or a harmonic of the frequency) used to generate the plasma in the discharge chamber 111, and thereby de-activate and remove energy and charged particles from the plasma. In one embodiment, the tuned LC circuit 105 includes electrically conductive metal (e.g., copper, silver, aluminum, gold, or various metal alloys or electrically conductive coatings, or equivalents), such as wires with a gauge of 12 to 18, or coils including electrically conductive metal with a diameter ranging from one eighth of an inch (~0.3 centimeters) to one quarter of an inch (~0.6 centimeters). In another embodiment, the tuned LC circuit 105 is wrapped around a Faraday shield (not shown) to increase the inductive coupling between the plasma and the tuned LC circuit. In one embodiment, forced air cooling of the passageway 118 is used.

Figure 7A:
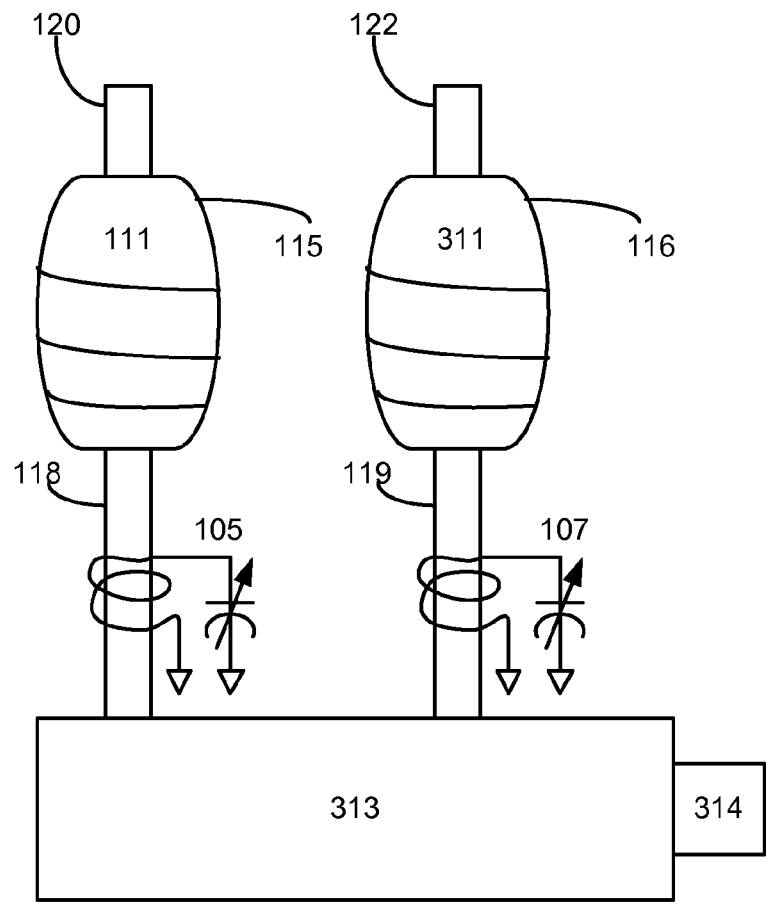
FIG. 7A illustrates a plasma generating and de-activation apparatus, in accordance with an alternative embodiment of the present invention, where two identical discharge chambers are coupled to a chamber for combining the plasmas from the discharge chambers.

When incompatible chamber materials and gas types occur (such as quartz and fluorine gas) multiple plasma sources can be used to dissociated each gas independently and the exhaust gas is combined to provide the desired mix of chemicals, such as in FIG. 7A.

Figure 6B:
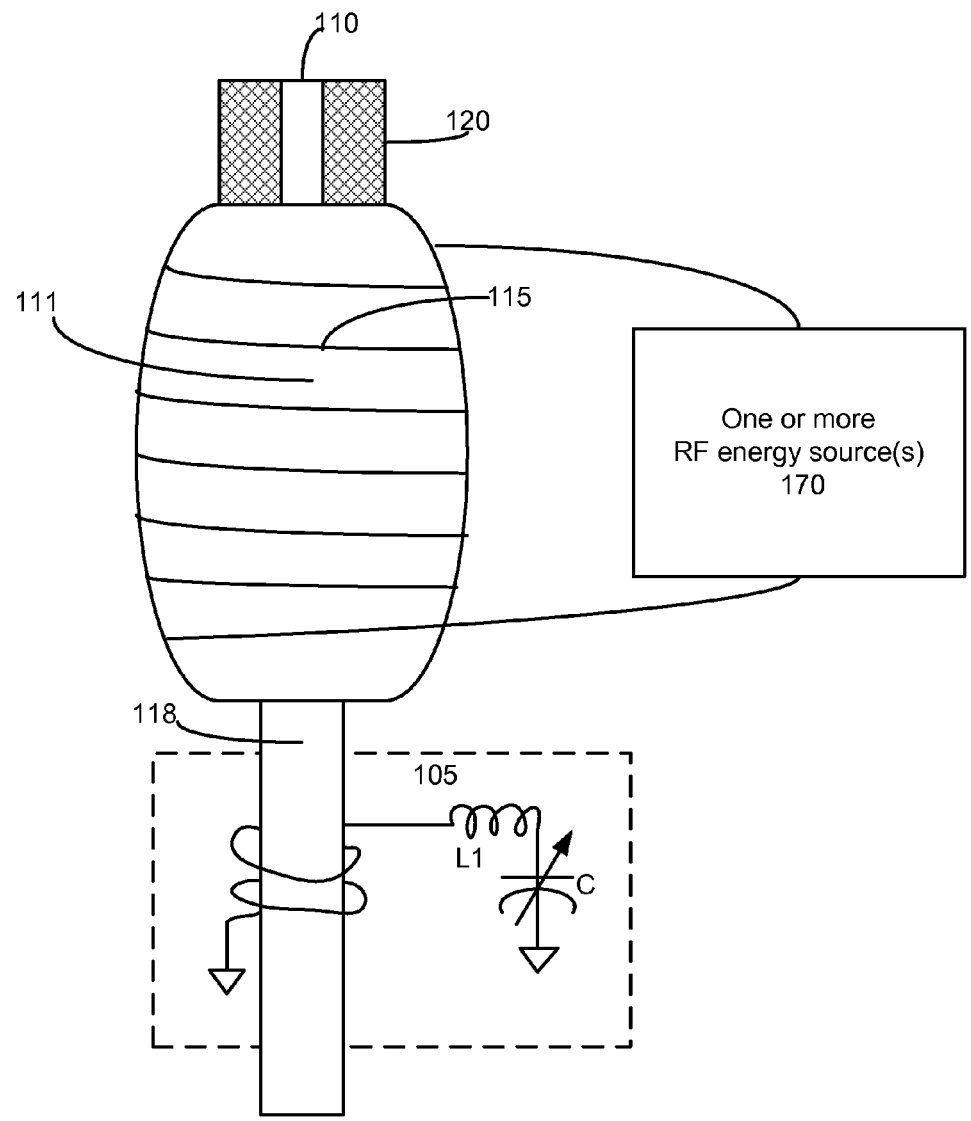
FIG. 6B illustrates a plasma generating and de-activation apparatus constructed in accordance with one embodiment of the invention, with an adjustable external inductor.

In FIG. 6B, a plasma generating discharge chamber includes a gas inlet 120 which supplies one or more gases to discharge chamber 111. Discharge chamber 111 also has a capillary tube 110 to prevent plasma expansion into gas inlet 120. One or more radio-frequency (RF) energy sources 170 are coupled to inductor 115, which surrounds discharge chamber 111 and dissociates one or more gases passing through discharge chamber 111, which may be made of various materials (e.g., a dielectric material or an equivalent). Discharge chamber 111 is coupled to a sample chamber (not shown) by a passageway 118. In various embodiments, the passageway 118 can be fabricated from quartz or ceramic tubes. Passageway 118 has a tuned LC circuit 105 that is grounded on the exhaust side of the passageway 118 to prevent unwanted capacitive coupling if a Faraday shield is not used, and includes an external inductor L1, where the tuned LC circuit 105 can be selectively tuned by a user (e.g., by adjusting an external variable capacitor and/or the inductor L1) to match the same radio frequency used to generate the plasma in the discharge chamber 111, and thereby de-activate and remove energy and charged particles from the plasma. In one embodiment, the tuned LC circuit 105 includes electrically conductive metal (e.g., copper, silver, aluminum, gold, or various metal alloys or electrically conductive coatings, or equivalents), such as wires with a gauge of 12 to 18, or coils including electrically conductive metal with a diameter ranging from one eighth of an inch (~0.3 centimeters) to one quarter of an inch (~0.6 centimeters), or coiled conductive metal tubes with an equal or larger diameter.

Figure 8:
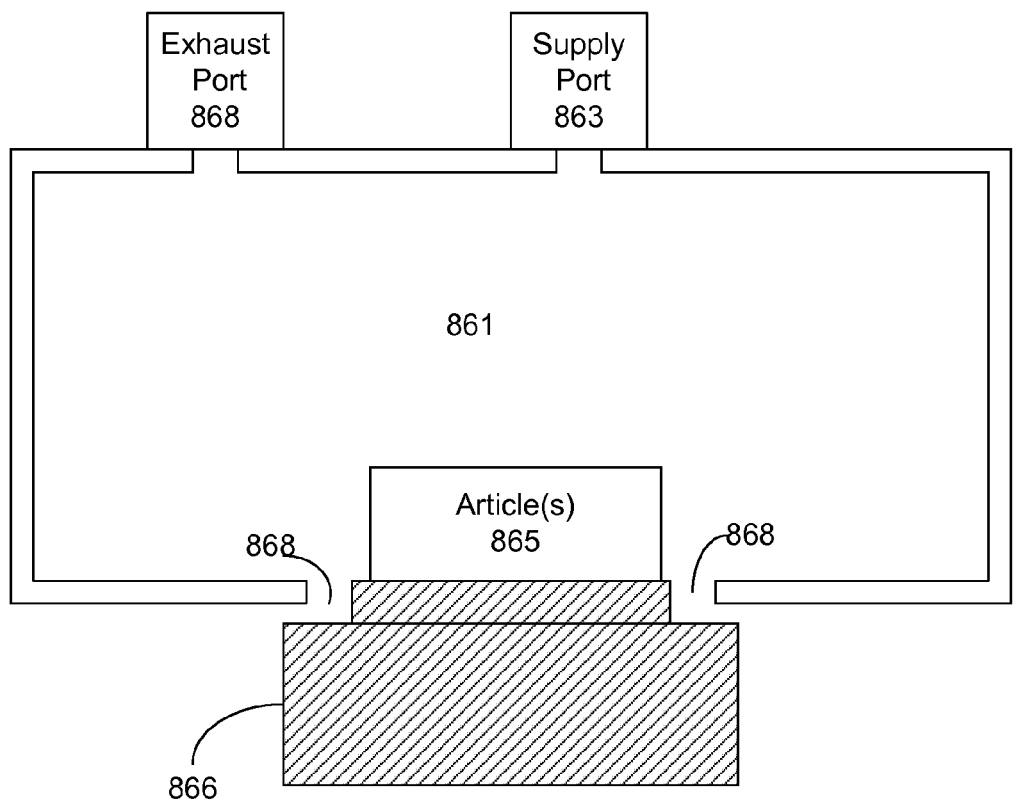
FIG. 8 illustrates a schematic cross-section of a chamber for processing one or more articles, in accordance with another embodiment of the invention.

FIG. 7A illustrates an embodiment of the invention in which the discharge chambers are essentially operating in parallel when inductors 115 and 116 are connected together to the same RF energy source(s). In an alternative embodiment, inductors 115 and 116 are connected to different RF energy source(s) to operate independently. In FIG. 7A, gas inlets 120 and 122 provide one or more gases to discharge chambers 111 and 311 which are coupled to chamber 313 for combining the plasma from the discharge chambers 111 and 311 and supplying plasma to chamber 313. Inductor 115 surrounds discharge chamber 111 and dissociates the gas passing through chamber 111. Similarly, inductor 116 surrounds discharge chamber 311 and dissociates the gas passing through chamber 311. The RF power is supplied to inductors 115 and 116 by one or more RF energy sources (not shown). Discharge chamber 111 is coupled to chamber 313 by passageway 118 and discharge chamber 311 is coupled to chamber 313 by passageway 119. Passageway 118 has a tuned LC circuit 105 that is grounded on the exhaust side of the passageway 118 to prevent unwanted capacitive coupling if a Faraday shield is not used, that can be selectively tuned by a user (e.g., by adjusting an external variable capacitor and/or inductor) to match the same radio frequency used to generate the plasma in the discharge chamber 111, and thereby de-activate and remove energy and charged particles from the plasma. Passageway 119 has a tuned LC circuit 107 that is grounded on the exhaust side of the passageway 119 to prevent unwanted capacitive coupling if a Faraday shield is not used, and that can be selectively tuned by a user (e.g., by adjusting an external variable capacitor and/or inductor) to match the same radio frequency used to generate the plasma in the discharge chamber 311, and thereby de-activate and remove energy and charged particles from the plasma. The reactive neutral species flow through passageways 118 and 119 into chamber 313, where they mix and pass through port 314 to a treatment chamber, such as shown in FIG. 8.

In various embodiments, the passageways 118 and 119 can be independently fabricated from quartz or ceramic tubes, or tubes of equivalent materials. In one embodiment, the tuned LC circuit 105 and/or 107 includes copper wires of gauge 12 to 18, or coiled tubes with a diameter ranging from one eighth of an inch (~0.3 centimeters) to one quarter of an inch (~0.6 centimeters).

In another embodiment, the tuned LC circuit 105 and/or 107 is wrapped around a Faraday shield (not shown) to increase the inductive coupling between the plasma and the tuned LC circuit. In one embodiment, forced air cooling of the passageways 118 and 119 is used.

In operation, a gas (e.g., an oxygen-based or halogen-based gas, or an equivalent gas) is supplied to discharge chamber 111 from a suitable source (not shown) and discharge chambers 111 and 311 are optionally supplied with one or more other gases from a suitable source (not shown). RF power from one or more RF energy sources (not shown) is coupled to the discharge chambers 111 and 311 by inductors 115 and 116.

Figure 7B:
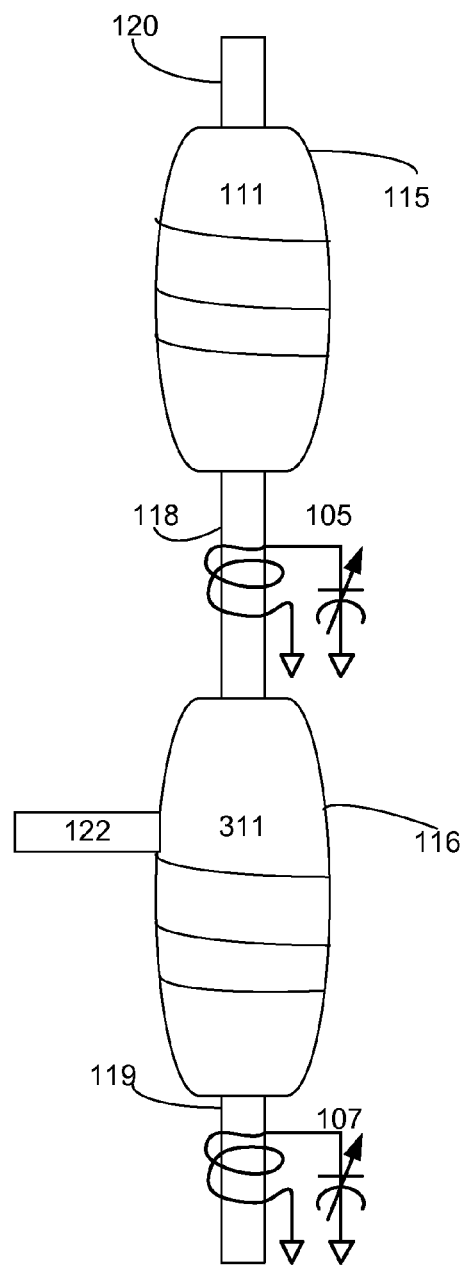
FIG. 7B illustrates an alternative embodiment of the invention in which two discharge chambers operate in series.

FIG. 7B illustrates an alternative embodiment of the invention in which the discharge chambers operate in series. One or more reactive gases are supplied to discharge chamber 111 and dissociated by RF power coupled through inductor 115 to pass through passageway 118 coupled to discharge chamber 311. One or more other gases are supplied through port 122 to discharge chamber 311 where the one or more gases are dissociated by the RF power from inductor 116 and exhausted through passageway 119. The RF power is supplied to inductors 115 and 116 individually or as a group by one or more RF energy sources (not shown). Passageway 118 has a tuned LC circuit 105 that is grounded on the exhaust side of the passageway 118 to prevent unwanted capacitive coupling if a Faraday shield is not used, and that can be selectively tuned by a user (e.g., by adjusting an external variable capacitor and/or inductor) to match the same radio frequency used to generate the plasma in the discharge chamber 111, and thereby de-activate and remove energy and charged particles from the plasma. Passageway 119 has a tuned LC circuit 107 that is grounded on the exhaust side of the passageway 119 to prevent unwanted capacitive coupling if a Faraday shield is not used, and that can be selectively tuned by a user (e.g., by adjusting an external variable capacitor and/or inductor) to match the same radio frequency used to generate the plasma in the discharge chamber 311, and thereby de-activate and remove energy and charged particles from the plasma.

In accordance with one alternative embodiment of the invention, inductor 116 is eliminated and the power applied to inductor 115 can range from as little as 10 watts to thousands of watts. When using a single inductor, the energy supplied to the reactive gas is coupled by the reactive gas to another gas, dissociating the other gas in discharge chamber 311. One or more gases are withdrawn through passageway 119 to a treatment chamber (such as shown in FIG. 8).

One or more RF energy source(s) 170 supply the power to each discharge chamber, connected either in parallel or independently (connections are not shown). Independent operation of each discharge chamber (such as, using different RF frequencies, different power levels ranging from tens to thousands of watts, and equivalent attributes) permit fast changes in plasma composition by simply varying the power levels in alternative embodiments of the invention.

The materials used to construct the passageways 118 and 119 can all be independently selected as desired. The materials used to construct the passageways 118 and 119 can be selected to be reactive or non-reactive with the plasma to which they are exposed.

FIG. 8 is a schematic cross-section of a chamber 861 for processing one or more articles. Chamber 861 includes one or more supply ports, such as supply port 863, for receiving one or more dissociated gases and distributing them uniformly over article(s) 865 on platen 866. In an alternative embodiment of the invention, platen 866 and/or chamber 861 are temperature-controlled to control the temperature of the article(s) 865. Gases are removed from chamber 861 by a suitable vacuum pump (not shown) through one or more exhaust ports 868. In an alternative embodiment of the invention, chamber 861 itself contains a plasma (not shown) generated directly in chamber 861, in addition to plasma supplied from other chambers.

The invention thus provides apparatus for efficiently de-activating one or more reactive gases in a plasma to provide de-activated neutral species, without contaminating the sources of the one or more reactive gases. In one embodiment of the invention, an increased amount of neutral atoms and molecules are created by the de-activation and recombination of active ions.

It will be apparent to those of skill in the art that various modifications can be made in terms of supplying the energy to dissociate the gases and produce plasma. As shown, RF power can be capacitively coupled, rather than inductively coupled, to one or more discharge chambers. Virtually any gas or mixture of gases can be dissociated at sufficient power densities in alternative embodiments of the invention.

Figure 9:
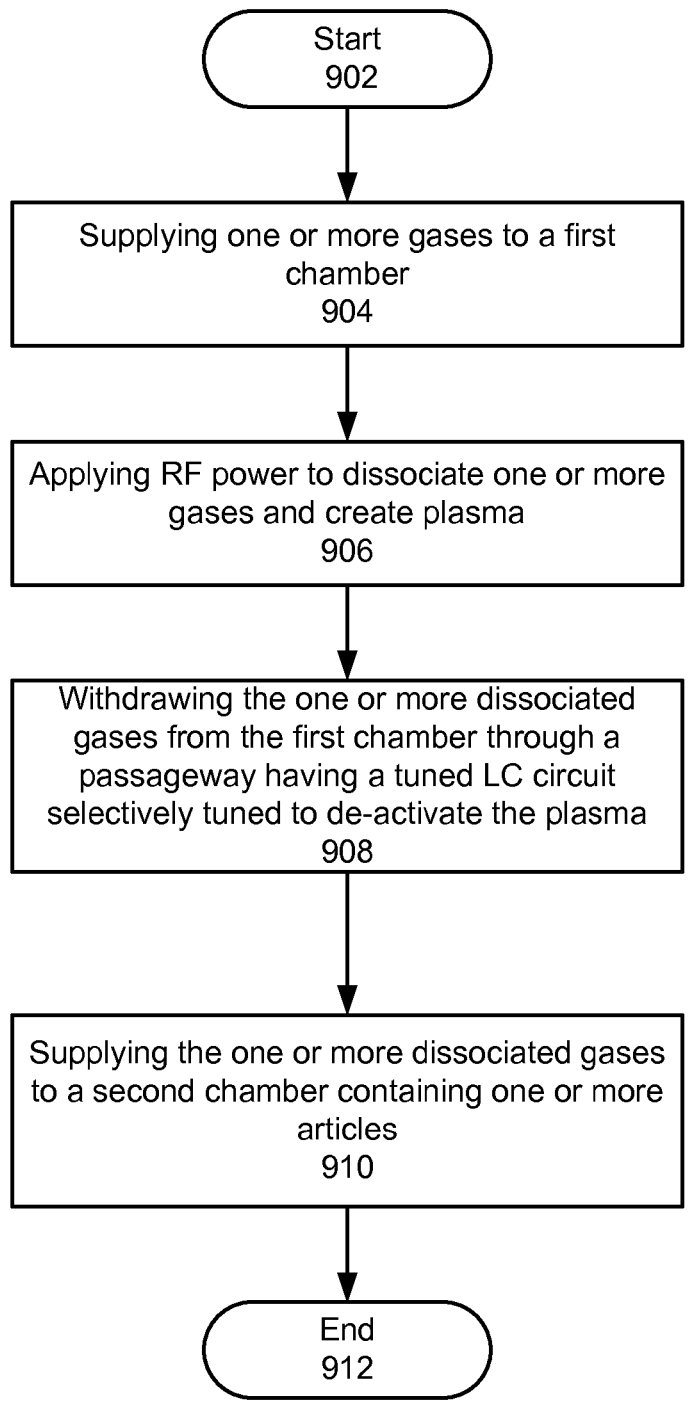
FIG. 9 illustrates a flowchart of a method to generate and de-activate a plasma, according to an alternative embodiment of the invention.

FIG. 9 illustrates a flowchart of a method to provide plasma, according to one embodiment of the invention. The sequence starts in operation 902. Operation 904 includes supplying one or more gases from a source to a first chamber. This operation in some embodiments of the invention would include using a means for controlling (i.e., reducing or preventing) expansion of plasma back through the source from the first chamber. Operation 906 includes applying RF power to dissociate one or more gases and create a plasma. Operation 908 includes withdrawing the one or more dissociated gases from the first chamber through a passageway coupled to a tuned LC circuit selectively tuned to de-activate the plasma.

Operation 910 includes supplying the one or more dissociated gases to a second chamber containing one or more articles. The method ends in operation 912.

Figure 10:
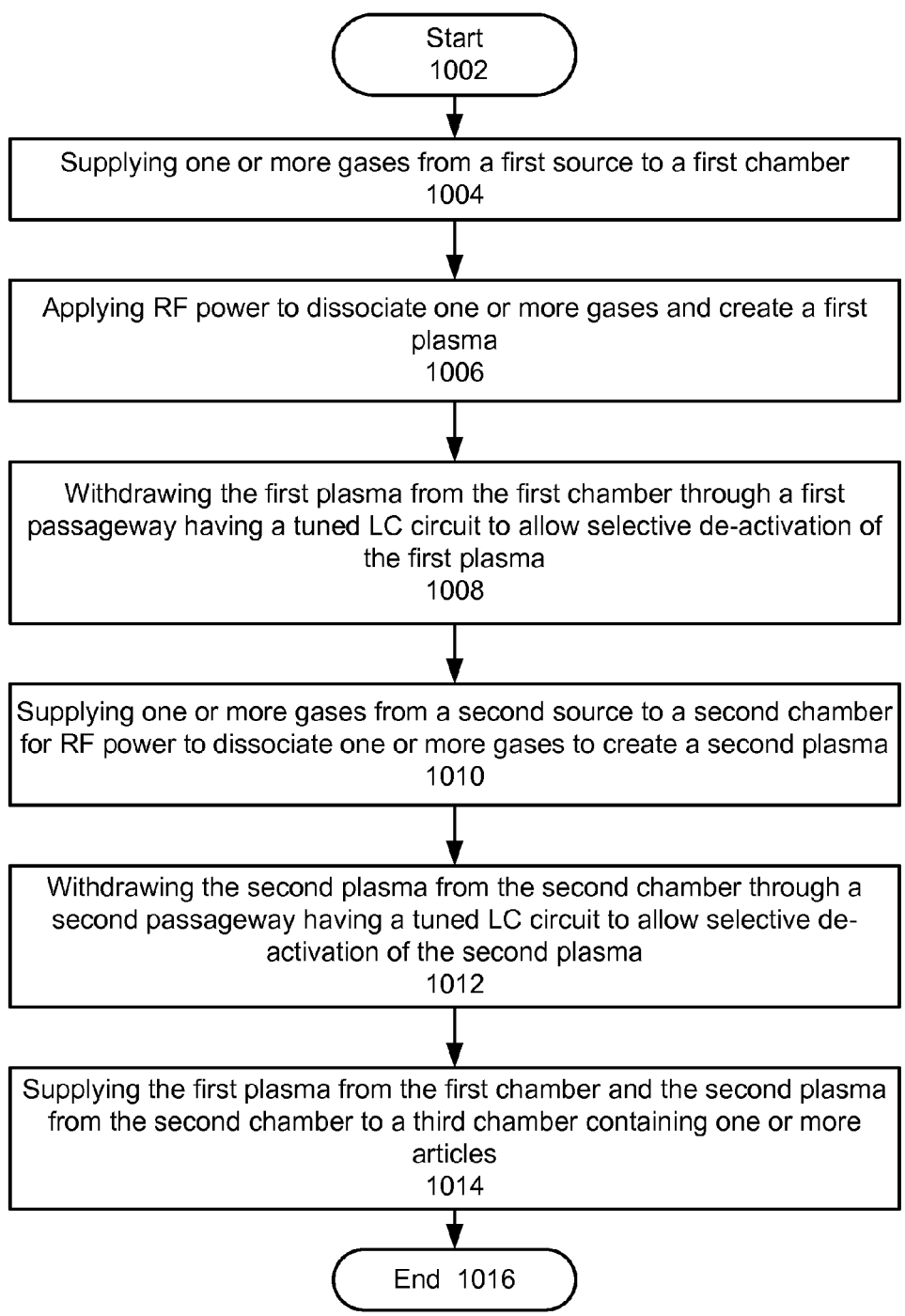
FIG. 10 illustrates a flowchart of a method to generate and de-activate a plasma in parallel, according to an alternative embodiment of the invention.

FIG. 10 illustrates a flowchart of a method to provide plasma, according to an alternative embodiment of the invention. The sequence starts in operation 1002. Operation 1004 is next and includes supplying one or more gases from a first source to a first chamber. Operation 1006 includes applying RF power to dissociate one or more gases and create a first plasma. Operation 1008 includes withdrawing the first plasma from the first chamber through a first passageway having first tuned LC circuit to allow selective de-activation of the first plasma. Operation 1010 includes supplying one or more gases from a second source to a second chamber for RF power to dissociate one or more gases to create a second plasma. Operation 1012 includes withdrawing the second plasma from the second chamber through a second passageway having a second tuned LC circuit to allow selective de-activation of the second plasma. Operation 1014 includes supplying the first plasma from the first chamber and the second plasma from the second chamber to a third chamber containing one or more articles. The method ends in operation 1016. In an alternative embodiment of the invention, one or more tuned LC circuits include externally modifiable inductors to allow a user to adjust the frequency of the tuned LC circuit to have no de-activation effects or reduced de-activation effects on the plasma, or to have a full de-activation effect on the plasma. In an alternative embodiment of the invention, one or more tuned LC circuits include a Faraday shield to increase the inductive coupling to the plasma during de-activation. In an alternative embodiment, the first chamber and the second chamber are constructed differently and use either inductive coupling or capacitive coupling to apply RF power to the chambers. In an alternative embodiment, the first chamber and the second chamber are constructed identically.

Figure 11:
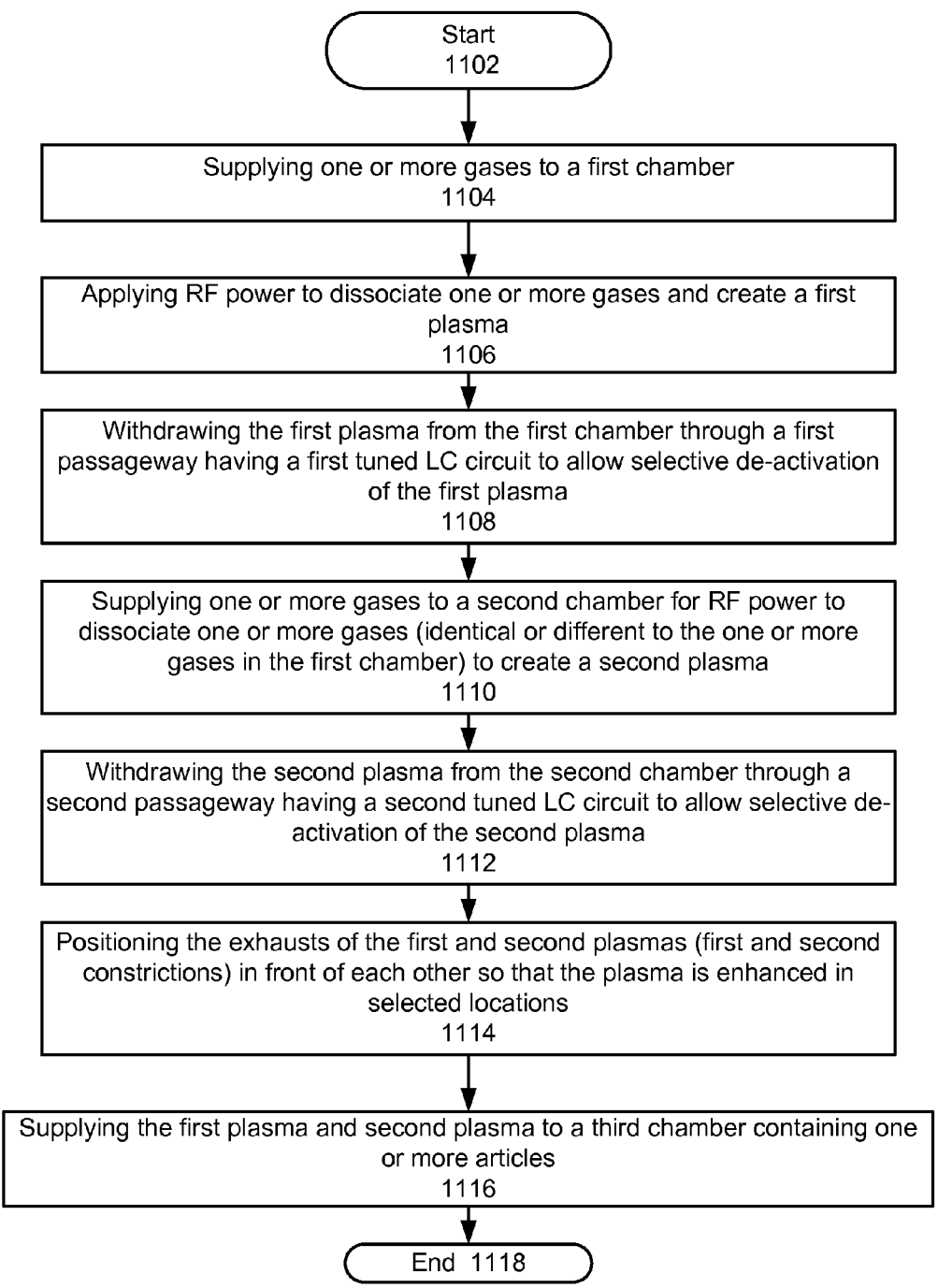
FIG. 11 illustrates a flowchart of a method to generate and de-activate a plasma in parallel, according to an alternative embodiment of the invention.

FIG. 11 illustrates a flowchart of a method to provide de-activated plasma, according to an alternative embodiment of the invention. The sequence starts in operation 1102. Operation 1104 includes supplying one or more gases to a first chamber. Operation 1106 includes applying RF power to dissociate one or more gases to create a first plasma. Operation 1108 includes withdrawing the first plasma from the first chamber through a first passageway inductively coupled to a tuned LC circuit to allow selective de-activation of the first plasma. Operation 1110 includes supplying one or more gases to a second chamber for RF power to dissociate one or more gases (identical or different to the one or more gases in the first chamber) to create a second plasma. Operation 1112 includes withdrawing the second plasma from the second chamber through a second passageway inductively coupled to a tuned LC circuit to allow selective de-activation of the second plasma. Operation 1114 includes positioning the exhaust of the first and second plasmas (first and second passageways) in front of each other so that the plasma is enhanced in selected locations. Operation 1116 includes supplying the first plasma and second plasma to a third chamber containing one or more articles. The method ends in operation 1118. In an alternative embodiment of the invention, one or more tuned LC circuits include an externally modifiable capacitor and/or inductor to allow a user to adjust the frequency of the tuned LC circuit to have no de-activation effects or reduced de-activation effects on the plasma, or to have a full de-activation effect on the plasma. In an alternative embodiment of the invention, one or more tuned LC circuits include a Faraday shield to increase the inductive coupling to the plasma during de-activation. In an alternative embodiment, the first chamber and the second chamber are constructed differently and use either inductive coupling or capacitive coupling to apply RF power to the chambers. In an alternative embodiment, the first chamber and second chamber are constructed identically.

Figure 12:
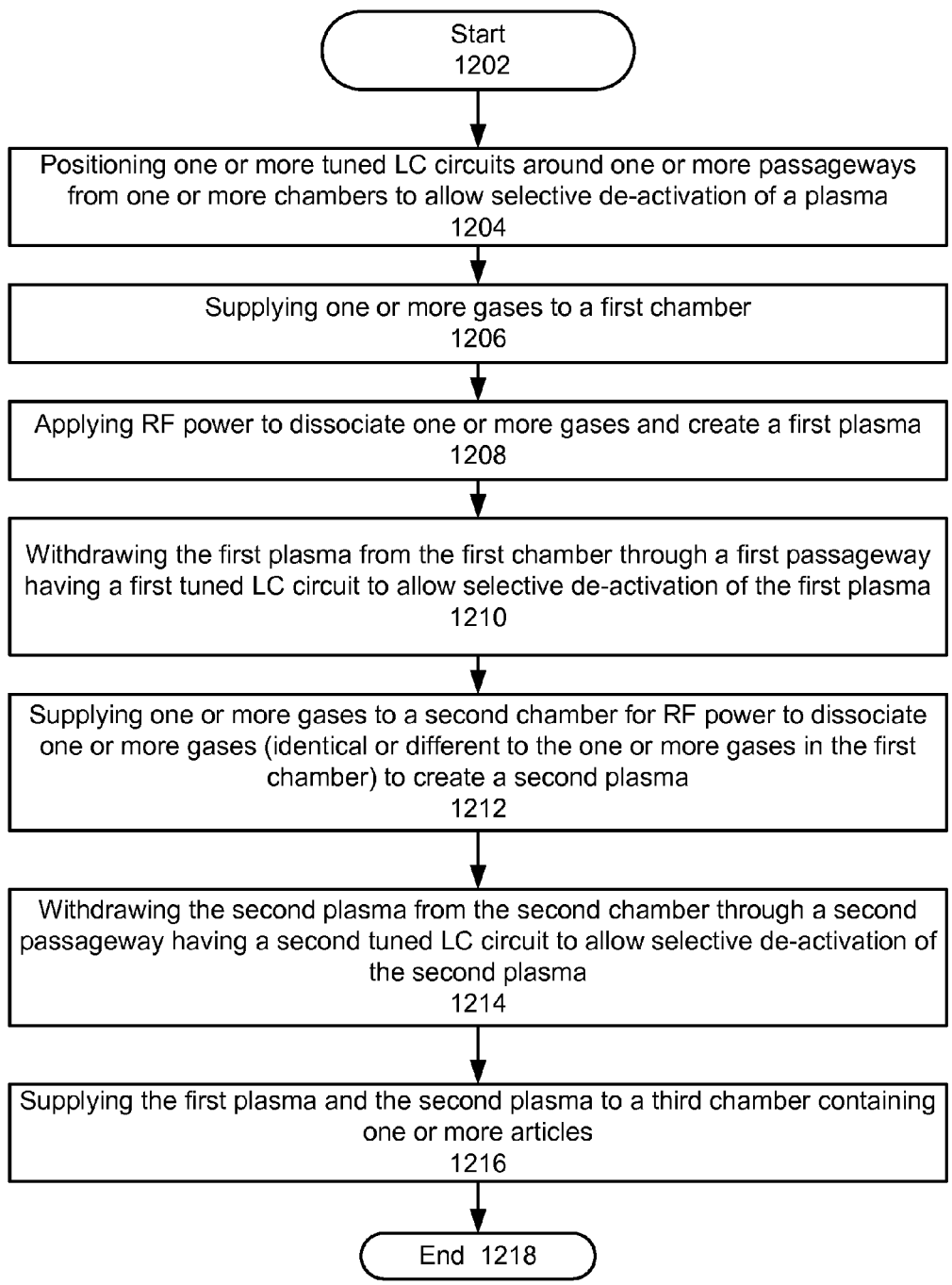
FIG. 12 illustrates a flowchart of a method to generate and de-activate a plasma in series, according to an alternative embodiment of the invention.

FIG. 12 illustrates a flowchart of a method to provide a de-activated plasma in series, according to an alternative embodiment of the invention. The sequence starts in operation 1202. Operation 1204 includes positioning one or more tuned LC circuits around one or more passageways from one or more chambers to allow a selective de-activation of a plasma. Operation 1206 includes supplying one or more gases to a first chamber. Operation 1206 in one embodiment of the invention would include a means for controlling the upstream expansion of the one or more gases. Operation 1208 includes applying RF power to dissociate one or more gases and create a first plasma. Operation 1210 includes withdrawing the first plasma from the first chamber through a first passageway having a first tuned LC circuit to allow selective de-activation of the first plasma. Operation 1212 includes supplying one or more gases to a second chamber in series to the first chamber to dissociate one or more gases (identical or different to the one or more gases in the first chamber) to create a second plasma. Operation 1214 includes withdrawing the second plasma from the second chamber through a second passageway having a second tuned LC circuit to allow selective de-activation of the second plasma. Operation 1216 includes supplying the first plasma and second plasma to a third chamber containing one or more articles. The method ends in operation 1218. In an alternative embodiment of the invention, one or more tuned LC circuits include an externally modifiable capacitor or inductor to allow a user to adjust the frequency of the tuned LC circuit to have no de-activation effects or reduced de-activation effects on the plasma, or to have a full de-activation effect on the plasma. In an alternative embodiment of the invention, one or more tuned LC circuits include a Faraday shield to increase the inductive coupling to the plasma during de-activation. In an alternative embodiment, the first chamber and the second chamber are constructed differently and use either inductive coupling or capacitive coupling to apply RF power to the chambers.

The exemplary embodiments described herein are for purposes of illustration and are not intended to be limiting. Therefore, those skilled in the art will recognize that other embodiments could be practiced without departing from the scope and spirit of the claims set forth below.

What is claimed is:

1. A method for treating one or more articles with a selectively de-activated plasma generated from dissociating one or more gases, said method comprising:
   supplying one or more gases from a source to a first chamber;
   applying RF power to dissociate said one or more gases and create a plasma;
   withdrawing said dissociated one or more gases from said first chamber through at least one passageway, wherein said at least one passageway has a tuned LC circuit with a tuned frequency to selectively de-activate said plasma in said at least one passageway; and
   supplying said dissociated one or more gases to a second chamber containing one or more articles.

2. The method of claim 1, further comprising:
   applying RF power to one or more gases in an additional chamber having a second passageway to dissociate said one or more gases from a second source into a second plasma, and de-activating said second plasma in said second passageway having a second tuned LC circuit having a second tuned frequency to selectively produce a second de-activated plasma, prior to supplying said de-activated second plasma to said second chamber containing one or more articles.

3. The method of claim 1, wherein at least one passageway having a tuned LC circuit also provides a maximized production of activated neutrals from said at least one passageway having a tuned LC circuit.

4. The method of claim 1, wherein each separate passageway has a separate tuned LC circuit having a separate tuned frequency.

5. A method for treating one or more articles with a selectively de-activated plasma generated by dissociating one or more gases, said method comprising:
   supplying one or more gases from a first source to a first chamber;
   applying RF power to dissociate said one or more gases from said first source to create a first plasma;
   withdrawing said first plasma from said first chamber through a first passageway and selectively de-activating said first plasma with a first passageway having a first tuned LC circuit having a first tuned frequency to selectively de-activate said first plasma;
   supplying one or more gases from a second source to a second chamber for RF power to dissociate said one or more gases from said second source to create a second plasma;
   using a second passageway to withdraw said second plasma from said second chamber and selectively de-activating said second plasma in said second passageway having a second tuned LC circuit having a second tuned frequency to selectively de-activate said second plasma; and
   supplying de-activated said first plasma from said first chamber and de-activated said second plasma from said second chamber to a third chamber containing one or more articles.

6. The method of claim 5, wherein said first chamber and said second chamber are supplying said first plasma and second plasma in parallel to said third chamber.

7. The method of claim 5, wherein said first chamber and said second chamber are supplying said first plasma and second plasma in series to said third chamber.

8. The method of claim 5, wherein said first passageway having a first tuned LC circuit and said second passageway having a second tuned LC circuit have an identical tuned frequency.

9. The method of claim 5, wherein said first passageway having a first tuned LC circuit and said second passageway having a second tuned LC circuit do not have the same tuned frequency.

10. The method of claim 5, wherein at least one passageway having a tuned LC circuit also provides a maximized production of activated neutrals from said passageway having a tuned LC circuit.

11. An apparatus for dissociating one or more gases to produce a plasma, said apparatus comprising:
    a first chamber with at least one passageway, having a first port coupled to a first source of one or more gases,
    one or more RF energy sources coupled to said first chamber,
    means for dissociating said one or more gases in said first chamber into said plasma,
    a passageway having a tuned LC circuit to selectively de-activate said plasma into a de-activated plasma, and a second chamber coupled to said first chamber through said passageway to receive said de-activated plasma, wherein said second chamber can contain one or more articles.

12. The apparatus of claim 11, wherein said means for dissociating said one or more gases includes inductively coupling RF energy to said one or more gases in said first chamber.

13. The apparatus of claim 11, wherein said means for dissociating said one or more gases includes a first electrode and a second electrode to capacitively couple RF energy to within said first chamber for dissociating said one or more gases.

14. The apparatus of claim 11, wherein said passageway having a tuned LC circuit maximizes the production of activated neutrals from said passageway having a tuned LC circuit.

15. The apparatus of claim 11, wherein said passageway having a tuned LC circuit includes an external inductor and an external variable air capacitor.

16. An apparatus to dissociate one or more gases to produce plasma, said apparatus comprising:
- a first chamber with a first passageway, having a first port coupled to a first source of one or more gases,
- a second chamber with a second passageway, having a second port coupled to a second source of one or more gases,
- one or more RF energy sources coupled to said first chamber and said second chamber,
- means for dissociating said one or more gases from said first port into a first plasma in said first chamber,
- means for dissociating said one or more gases from said second port into a second plasma in said second chamber;
- at least one passageway having an externally variable tuned LC circuit to selectively de-activate at least one plasma from either said first chamber or from said second chamber; and
- a third chamber coupled to said first chamber and said second chamber, wherein said third chamber contains one or more articles.

17. The apparatus of claim 16, wherein an external inductor is electrically coupled in said externally variable tuned LC circuit.

18. The apparatus of claim 16, wherein said externally tuned LC circuit includes a variable air capacitor.

19. The apparatus of claim 16, wherein said at least one externally variable tuned LC circuit includes a Faraday shield to increase inductive coupling to a plasma that is to be de-activated.

20. The apparatus of claim 16, wherein said first chamber and said second chamber supply said first plasma and said second plasma in parallel to said third chamber.

21. The apparatus of claim 16, wherein said first chamber and said second chamber supply said first plasma and said second plasma in series to said third chamber.

* * * * *